(12) United States Patent
Hufgard (10) Patent No.: US 8,198,713 B2
(45) Date of Patent: Jun. 12, 2012

(54) SEMICONDUCTOR WAFER STRUCTURE

(75) Inventor: Erich Hufgard, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 131 days.

(21) Appl. No.: 11/777,743

(22) Filed: Jul. 13, 2007

(65) Prior Publication Data

US 2009/0014857 A1 Jan. 15, 2009

(51) Int. Cl.
*H01L 23/06* (2006.01)
*H01L 21/02* (2006.01)

(52) U.S. Cl. ........ 257/678; 257/680; 257/777; 257/787; 257/E31.11; 257/E31.117; 257/E25.023; 257/E25.027; 257/E23.01; 438/106; 438/109; 438/112; 438/116; 438/125; 438/126; 438/127; 438/460; 438/462

(58) Field of Classification Search .................. 257/777, 257/678
See application file for complete search history.

(56) References Cited

U.S. PATENT DOCUMENTS

| | | | |
|---|---|---|---|
| 6,316,289 B1 * | 11/2001 | Chung | 438/118 |
| 6,351,028 B1 * | 2/2002 | Akram | 257/686 |
| 6,521,480 B1 * | 2/2003 | Mitchell et al. | 438/108 |
| 6,531,784 B1 * | 3/2003 | Shim et al. | 257/777 |
| 6,593,662 B1 * | 7/2003 | Pu et al. | 257/777 |
| 6,847,105 B2 * | 1/2005 | Koopmans | 257/686 |
| 6,930,396 B2 * | 8/2005 | Kurita et al. | 257/777 |
| 6,933,172 B2 | 8/2005 | Tomimatsu | |
| 6,943,294 B2 * | 9/2005 | Kang et al. | 174/541 |
| 7,023,079 B2 * | 4/2006 | Wang et al. | 257/686 |
| 7,067,927 B1 * | 6/2006 | Mostafazadeh | 257/777 |
| 7,071,568 B1 | 7/2006 | St. Amand et al. | |
| 7,144,745 B2 * | 12/2006 | Badehi | 438/7 |
| 7,208,346 B2 | 4/2007 | Lee | |
| 7,211,466 B2 * | 5/2007 | Lo et al. | 438/109 |
| 7,459,776 B1 * | 12/2008 | St. Amand et al. | 257/686 |
| 7,518,223 B2 * | 4/2009 | Derderian | 257/686 |
| 2002/0079567 A1 * | 6/2002 | Lo et al. | 257/685 |
| 2003/0189259 A1 * | 10/2003 | Kurita et al. | 257/777 |
| 2004/0104460 A1 * | 6/2004 | Stark | 257/678 |
| 2005/0077605 A1 * | 4/2005 | Yu et al. | 257/678 |
| 2005/0104183 A1 * | 5/2005 | Kuroda et al. | 257/686 |
| 2005/0224943 A1 | 10/2005 | Sahaida et al. | |
| 2005/0224959 A1 * | 10/2005 | Kwon et al. | 257/723 |
| 2006/0035415 A1 * | 2/2006 | Wood et al. | 438/125 |
| 2006/0186525 A1 * | 8/2006 | Theuss et al. | 257/686 |
| 2006/0191215 A1 * | 8/2006 | Stark | 52/204.6 |
| 2006/0249839 A1 | 11/2006 | Yoshida | |
| 2006/0270104 A1 * | 11/2006 | Trovarelli et al. | 438/106 |
| 2007/0085184 A1 | 4/2007 | Kwon et al. | |
| 2007/0178666 A1 * | 8/2007 | Do et al. | 438/460 |
| 2008/0012095 A1 * | 1/2008 | Lee et al. | 257/618 |
| 2008/0042245 A1 * | 2/2008 | Lee et al. | 257/620 |
| 2008/0054429 A1 * | 3/2008 | Bolken et al. | 257/686 |
| 2008/0131999 A1 * | 6/2008 | Takiar et al. | 438/109 |
| 2009/0014857 A1 * | 1/2009 | Hufgard | 257/686 |

FOREIGN PATENT DOCUMENTS

KR 1053901 7/2001

\* cited by examiner

*Primary Examiner* — Minhloan T Tran
*Assistant Examiner* — William Harriston
(74) *Attorney, Agent, or Firm* — Dicke, Billig & Czaja, PLLC (57) ABSTRACT

One embodiment provides a semiconductor wafer structure including a semiconductor wafer and a spacer layer. The semiconductor wafer includes active areas. The spacer layer is configured to provide spacing between the semiconductor dice in a stacked die package and the spacer layer is disposed on one side of the semiconductor wafer.

16 Claims, 5 Drawing Sheets

SEMICONDUCTOR WAFER STRUCTURE

BACKGROUND

Market demand for smaller, lighter, and more powerful electronic devices drives the development of more compact packages and increased functionality. Demand for electronic devices, such as cellular telephones, personal digital assistants, and portable computing devices, contributes heavily to the overall market demand. Development of more compact packages and increased functionality has led to packaging technologies such as fine pitch ball grid arrays (FBGA), chip scale packages (CSP), wafer level packaging (WLP), multi-chip module (MCM) technology, and stacked die packaging. An MCM includes multiple semiconductor die in one package, such as multiple stacked die in a CSP or multiple stacked die on a BGA. Increasing the functionality has led to system in package (SiP) solutions.

SiP products are fully functional systems or sub-systems in a semiconductor package. Typically, SiP products include components that are traditionally found on a system mother board. These components include integrated circuit chips or die, surface mount discrete passive components, integrated passive networks, passive components embedded or patterned into the package substrate, filters, electromagnetic interference shields, and micro-electromechanical system (MEMS) devices including semiconductor sensors and semiconductor lasers. Some SiP products use stacked die packaging technology.

In stacked die packaging, semiconductor dice are stacked in the third dimension as opposed to the two area dimensions. The semiconductor dice are stacked one semiconductor die on top of another semiconductor die and electrically interconnected in a single package. Stacking semiconductor dice in the third dimension increases efficient use of printed circuit board area. Using stacked die packaging results in smaller and lighter packages, reduced packaging costs, reduced system level costs for SiP products, and reduced system level sizes due to smaller footprints and decreased component count. Applications include flash memory and static random access memory (SRAM) combinations used in cellular systems.

Different technologies have been explored for stacking and connecting semiconductor dice in a stacked die package. Typically, stacked die are arranged in a pyramid stacked die configuration or an overhanging stacked die configuration. Wire bonding is a popular interconnection method due to existing infrastructure, flexibility, and cost advantages. In a pyramid stacked die configuration, a smaller die is placed on top of a larger die and a wire loop from the top die clears the edge of the bottom die as well as the wire loops of the bottom die. In an overhanging stacked die configuration, a larger die is placed on top of a smaller die and a spacer situated between the semiconductor dice provides space for the wire loops of the bottom die. In each configuration, spacers may be situated between the semiconductor dice, which increases production time, inventories, and system costs.

For these and other reasons there is a need for the present invention.

SUMMARY

The present disclosure describes a semiconductor wafer structure including a spacer layer. One embodiment provides a semiconductor wafer structure including a semiconductor wafer and a spacer layer. The semiconductor wafer includes active areas. The spacer layer is configured to provide spacing between the semiconductor dice in a stacked die package and the spacer layer is disposed on one side of the semiconductor wafer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
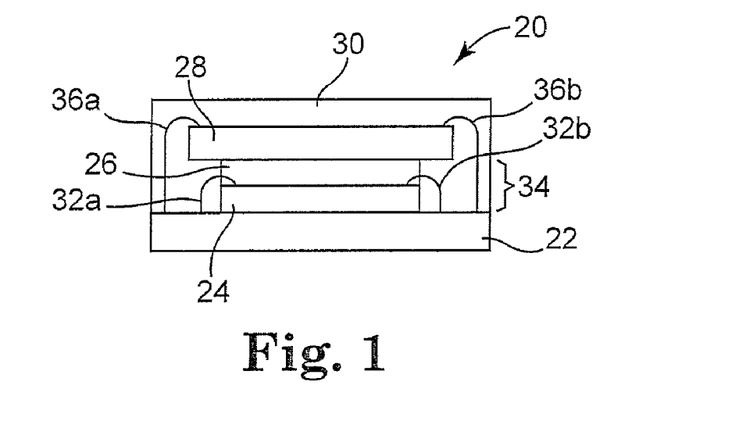
FIG. 1 is a diagram illustrating one embodiment of a stacked die package according to the present invention.

FIG. 1 is a diagram illustrating one embodiment of a stacked die package 20. Stacked die package 20 includes a package substrate 22, a first semiconductor die 24, a spacer 26, a second semiconductor die 28, and encapsulation material 30. Package substrate 22 can be any suitable carrier capable of carrying a semiconductor die, such as a lead frame and/or a ceramic substrate including redistribution metallization. Stacked die package 20 can be any suitable type of package, such as a stacked die lead frame package, a stacked die BGA package, or a stacked die CSP.

First semiconductor die 24 is attached to substrate 22 and first semiconductor die 24 is electrically coupled to substrate 22 via first wire loops 32a and 32b. Spacer 26 is attached to first semiconductor die 24, where spacer 26 is a singulated piece of a spacer layer disposed on the semiconductor wafer including first semiconductor die 24. Semiconductor device 34 in stacked die package 20 includes first semiconductor die 24 and spacer 26, which are fabricated together via the wafer level processing. Second semiconductor die 28 is attached to spacer 26 and second semiconductor die 28 is electrically coupled to substrate 22 via second wire loops 36*a* and 36*b*. Encapsulation material 30 is disposed over first semiconductor die 24, spacer 26, and second semiconductor die 28.

In one embodiment, first semiconductor die 24 is electrically coupled to second semiconductor die 28 via first wire loops 32*a* and 32*b* and second wire loops 36*a* and 36*b*. In other embodiments, first semiconductor die 24 can be a flip chip attached and electrically coupled to substrate 22 and spacer 26 is attached to the back of first semiconductor die 24, where spacer 26 is a piece of a spacer layer disposed onto the back of the semiconductor wafer including first semiconductor die 24.

In one aspect, a spacer layer is disposed on a semiconductor wafer in a wafer level process to cover substantially all of one side of the wafer. In one embodiment, the spacer layer is disposed substantially over the top side of the wafer, which includes active areas defining topologies. In one embodiment, the spacer layer is disposed substantially over the back side of the wafer.

The wafer includes multiple semiconductor dice, such as first semiconductor die 24, and the wafer and spacer layer are singulated to provide singulated spacers, also referred to as wafer level spacers, and singulated semiconductor die. A singulated spacer is attached to each of the singulated semiconductor die and the sides of the singulated spacer are substantially flush with the sides of the singulated semiconductor die. The singulated spacer is used to separate the singulated semiconductor die from other semiconductor die stacked above or below the singulated semiconductor die in a stacked die package.

The spacer layer including spacer 26 can be patterned in a wafer level process to accommodate active areas defining topologies, including bond pads. In one embodiment, spacer 26 is patterned in a wafer level process to accommodate active areas defining a topology in first semiconductor die 24. In one embodiment, spacer 26 is patterned in a wafer level process to accommodate active areas defining a topology in second semiconductor die 28, which is stacked on top of spacer 26. In one embodiment, first semiconductor die 24 is an application specific integrated circuit (ASIC) and second semiconductor die 28 is a sensor, which combines the sensing features of the sensor with sensor evaluation/control features of the ASIC.

Spacer 26 can have a thickness based on the application. If stacking a high voltage power transistor chip and a logic control circuit chip, a larger spacer thickness may be used to protect the stacked chips from each other against high voltage breakdown. Also, a large spacer thickness may be used to provide headroom below the second semiconductor die 28 for first wire loops 32*a* and 32*b*, which electrically connect first semiconductor die 24 to substrate 22. In one embodiment, the thickness of spacer 26 is in the range of 10 to 1000 micrometer.

Singulated spacers, such as spacer 26, are produced in a wafer level process to provide spacing between semiconductor dice in a stacked die package. The singulated spacers provide room for wire bonding and can be patterned around bond pads to support stacked die in the stacked die package. Each semiconductor device, such as semiconductor device 34, includes a semiconductor die and singulated spacer produced in a wafer level process, which reduces production time, production inventories, and system costs.

Figure 2:
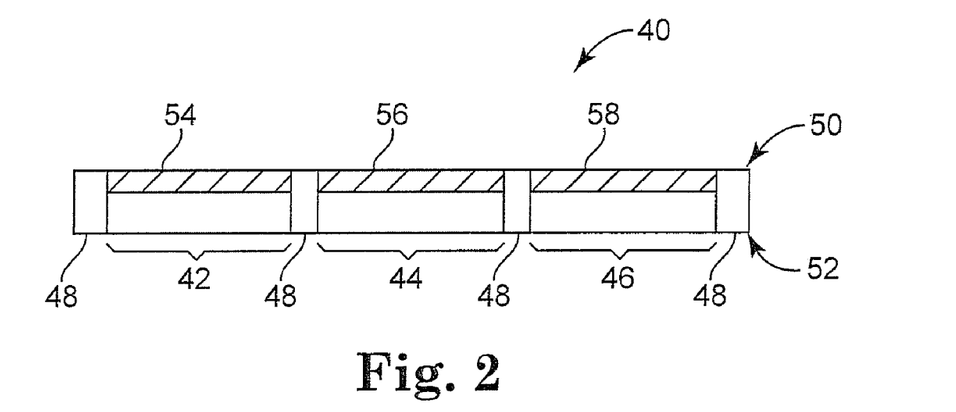
FIG. 2 is a diagram illustrating one embodiment of a semiconductor wafer including multiple semiconductor die.

FIG. 2 is a diagram illustrating one embodiment of a semiconductor wafer 40 including multiple semiconductor die 42, 44, and 46. Wafer 40 includes internal spacing areas 48 around the perimeter of wafer 40 and between semiconductor dice 42, 44, and 46. Wafer 40 has a top side 50 and a back side 52. Wafer 40 can be any suitable size and include any suitable number of semiconductor dice. In one embodiment, wafer 40 is an 8" wafer. In one embodiment, wafer 40 is a 12" wafer.

The semiconductor dice 42, 44, and 46 include active areas defining a topology 54, 56, and 58 in or near the top side 50 of wafer 40. Semiconductor die 42 includes active area 54, semiconductor die 44 includes active area 56, and semiconductor die 46 includes active area 58. In one embodiment, one or more of the active areas 54, 56, and 58 includes an integrated circuit having active elements, such as transistors. In one embodiment, one or more of the active areas 54, 56, and 58 includes a MEM device or system. In one embodiment, one or more of the active areas 54, 56, and 58 includes a semiconductor sensor, such as a semiconductor pressure sensor, a semiconductor acceleration sensor, a semiconductor microphone, a semiconductor optical sensor, or a semiconductor gas sensor. In one embodiment, one or more of the active areas 54, 56, and 58 includes a semiconductor laser.

Figure 3:
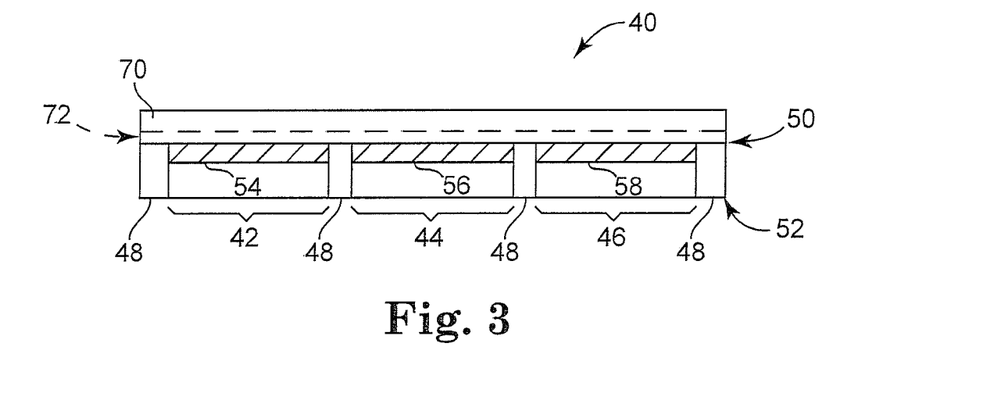
FIG. 3 is a diagram illustrating one embodiment of a space layer on a semiconductor wafer.

FIG. 3 is a diagram illustrating one embodiment of a spacer layer 70 on semiconductor wafer 40. Spacer layer 70 is disposed on wafer 40 in a wafer level batch process as either a solid slab of material or a liquid. Spacer layer 70 is disposed on the top side 50 of wafer 40 and over the active areas defining a topology 54, 56, and 58 in semiconductor dice 42, 44, and 46, respectively. Optionally, a passivation layer 72 is disposed on wafer 40 and spacer layer 70 is disposed over passivation layer 72. In one embodiment, passivation layer 72 is an oxide layer. In other embodiments, spacer layer 70 can be disposed on the back side 52 of wafer 40.

In one embodiment, spacer layer 70 is a solid slab of material, such as a solid state material, silicon, glass epoxy, or other suitable electrically insulating material. The thickness of solid slab spacer layer 70 can be varied using more than one piece of material or different thicknesses of material. In one embodiment, the solid slab spacer layer 70 is attached to wafer 40 via an adhesive. In one embodiment, the solid slab spacer layer 70 is attached to wafer 40 via solder. In one embodiment, the solid slab spacer layer 70 is attached to wafer 40 via anodic bonding.

In one embodiment, spacer layer 70 is disposed as a liquid, such as a polyimide, on wafer 40. The liquid hardens to form spacer layer 70. The thickness of spacer layer 70 formed via a liquid can be varied using more than one layer of liquid material or different liquid thicknesses. Spacer layer 70 is disposed on wafer 40 in liquid form via immersion dipping, spraying with an airbrush, or spin coating.

Figure 4:
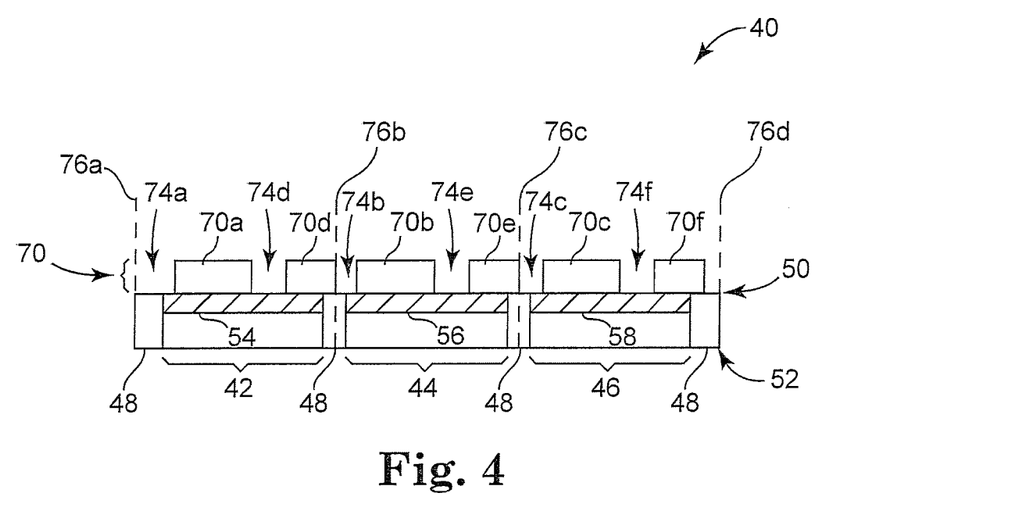
FIG. 4 is a diagram illustrating one embodiment of a wafer and a patterned spacer layer.

FIG. 4 is a diagram illustrating one embodiment of wafer 40 and a patterned spacer layer 70. Spacer layer 70 is structured to accommodate active areas defining topologies 54, 56, and 58 in semiconductor dice 42, 44, and 46. Other semiconductor dice and/or structures can be stacked on top of and supported by the patterned spacer layer 70. In other embodiments, spacer layer 70 is disposed on the back side 52 of wafer 40 and spacer layer 70 is structured to accommodate active areas defining topologies in semiconductor dice stacked below semiconductor dice 42, 44, and 46 in stacked die packages. In other embodiments, spacer layer 70 is disposed on the back side 52 of wafer 40 and spacer layer 70 is structured to accommodate any suitable structures.

Patterned spacer layer 70 includes spacer layer portions 70*a*-70*f* on wafer 40 and semiconductor dice 42, 44, and 46. Patterned space layer 70 includes spacer layer portions 70*a* and 70*d* on semiconductor die 42, spacer layer portions 70*b* and 70*e* on semiconductor die 44, and spacer layer portions 70*c* and 70*f* on semiconductor die 46. Spacer layer portions 70*a*-70*f* support semiconductor dice stacked on top of spacer layer 70 and semiconductor dice 42, 44, and 46 in stacked die packages.

Spacer layer 70 is patterned to provide open areas 74*a*-74*f* in spacer layer 70. Open areas 74*a*-74*f* are above active areas defining a topology 54, 56, and 58 in semiconductor dice 42, 44, and 46. Active areas defining a topology 54, 56, and 58 include electrical areas, MEM system areas, sensors, bond pads, and light emitting elements, such as light emitting diodes (LEDs) and lasers. In one embodiment, open areas 74*a*-74*c* are above bond pads in semiconductor dice 42, 44, and 46. In one embodiment, open areas 74*d*-74*f* are above MEM system areas in semiconductor dice 42, 44, and 46.

Spacer layer 70 is patterned in a wafer level batch process. In one embodiment, spacer layer 70 is patterned in a wafer level process after being disposed on wafer 40. In one embodiment, spacer layer 70 is pre-formed and/or patterned in a wafer level process prior to being disposed on wafer 40. In one embodiment, spacer layer 70 is patterned via photolithographic processing and etching. In one embodiment, spacer layer 70 is patterned via photoablation, which is the photonic excitation and separation of a chemical bond by absorbtion of photons of quantum energy that is higher than the bonding energy of the molecule. In one embodiment, spacer layer 70 is patterned via mechanical treatment, such as sawing, milling, grinding, punching, molding, casting, and/or drilling. In one embodiment, spacer layer 70 is patterned in a wafer level batch process to provide different patterns in spacer layer 70 over different semiconductor dice 42, 44, or 46.

Wafer 40 is diced along dashed lines 76*a*-76*d* to provide singulated spacers from spacer layer 70 and singulated semiconductor die 42, 44, and 46.

Figure 5:
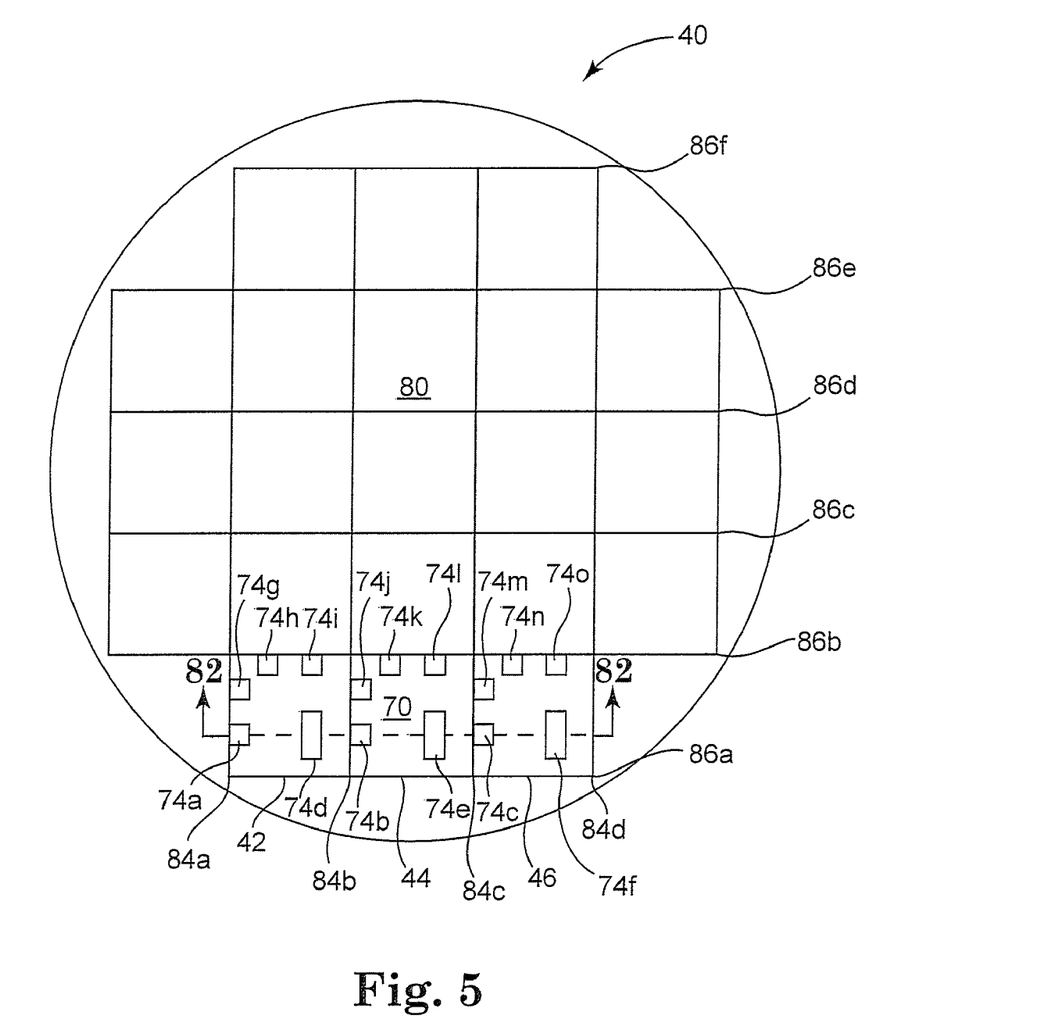
FIG. 5 is a top view diagram of a wafer including a patterned spacer layer.

FIG. 5 is a top view diagram of wafer 40 including patterned spacer layer 70. Wafer 40 includes multiple semiconductor die, indicated at 80 and including semiconductor dice 42, 44, and 46. FIG. 4 is a cross section diagram of wafer 40 taken along the line at 82. In one embodiment, all semiconductor dice 80 on wafer 40 are substantially the same. In one embodiment, wafer 40 includes multiple different semiconductor dice.

Semiconductor dice 42, 44, and 46 are substantially the same and spacer layer 70 is patterned substantially the same on each of them. Spacer layer 70 is patterned in a wafer level batch process to provide open areas 74*a*-74*f* in spacer layer 70 above semiconductor dice 42, 44, and 46. In addition, spacer layer 70 is patterned in the wafer level process to provide open areas 74*g*-74*o* above semiconductor dice 42, 44, and 46. In one embodiment, open areas 74*a*-74*c* and 74*g*-74*o* are above bond pads in semiconductor dice 42, 44, and 46, which allows wire bonding to semiconductor dice 42, 44, and 46. In one embodiment, open areas 74*d*-74*f* are above MEM system areas in semiconductor dice 42, 44, and 46.

In one embodiment, wafer 40 is diced along the lines at 84*a*-84*d* and along the lines at 86*a*-86*f* to provide singulated spacers from spacer layer 70 on each of the singulated semiconductor die 42, 44, and 46. In a stacked die package, another semiconductor die is stacked on top of one of the singulated spacers from spacer layer 70, which is on one of the singulated semiconductor die 42, 44, and 46. The singulated spacer supports the other semiconductor die in the stacked die package.

In one embodiment, semiconductor dice are stacked on spacer layer 70 prior to dicing or singulating wafer 40. Wafer 40 is diced to provide singulated semiconductor dice, where each semiconductor die has a singulated spacer on the semiconductor die and a stacked semiconductor die on the spacer. The semiconductor die, spacer, and stacked semiconductor die are attached to a package substrate in a stacked die package.

In one singulation process, wafer 40 and spacer layer 70 are singulated in different process steps to provide a semiconductor die and spacer. For example, spacer layer 70 is singulated as spacer layer 70 is patterned via photolithography and etching, photoablation, or a mechanical process and wafer 40 is singulated via a separate process, such as laser cutting, water beam cutting, or another mechanical process.

In one singulation process, wafer 40 and spacer layer 70 are singulated in substantially the same process step to provide a semiconductor die and spacer. For example, wafer 40 and spacer layer 70 are singulated via a mechanical process.

Figure 6:
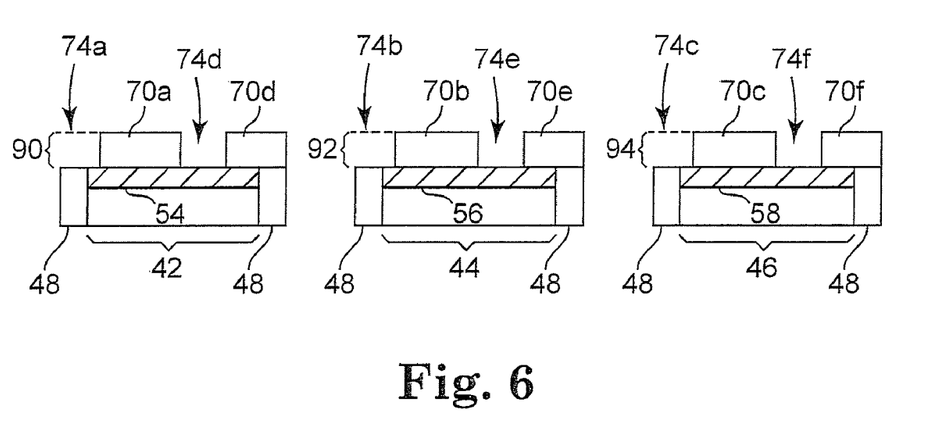
FIG. 6 is a diagram illustrating one embodiment of singulated semiconductor die and singulated spacers.

FIG. 6 is a diagram illustrating one embodiment of singulated semiconductor die 42, 44, and 46 and singulated spacers 90, 92, and 94. One of the spacers 90, 92, and 94 is on each of the semiconductor die 42, 44, and 46. Spacer 90 is on semiconductor die 42, spacer 92 is on semiconductor die 44, and spacer 94 is on semiconductor die 46. Wafer 40 including patterned spacer layer 70 is diced along the lines at 84*a*-84*d* and 86*a*-86*f* to provide singulated semiconductor die 42, 44, and 46 and singulated spacers 90, 92, and 94. Each side of each spacer 90, 92, and 94 is substantially flush with the corresponding side of the corresponding semiconductor die 42, 44, and 46, unless a side has been removed via patterning of the spacer(s) 90, 92, and 94.

Semiconductor dice 42, 44, and 46 and internal spacing areas 48 support the spacers 90, 92, and 94. Spacer 90 on semiconductor die 42 includes spacer layer portions 70*a* and 70*d*, spacer 92 on semiconductor die 44 includes spacer layer portions 70*b* and 70*e*, and spacer 94 on semiconductor die 46 includes spacer layer portions 70*c* and 70*f*.

Semiconductor die 42 has spacer layer portions 70*a* and 70*d* on active area 54. In a stacked die package, spacer layer portions 70*a* and 70*d* support another semiconductor die. Open areas 74*a* and 74*d* provide space for bond wires and operation of active area 54 in the stacked die package.

Semiconductor die 44 has spacer layer portions 70*b* and 70*e* on active area 56. In a stacked die package, spacer layer portions 70*b* and 70*e* support another semiconductor die. Open areas 74*b* and 74*e* provide space for bond wires and operation of active area 56 in the stacked die package.

Semiconductor die 46 has spacer layer portions 70*c* and 70*f* on active area 58. In a stacked die package, spacer layer portions 70*c* and 70*f* support another semiconductor die. Open areas 74*c* and 74*f* provide space for bond wires and operation of active area 58 in the stacked die package.

Figure 7:
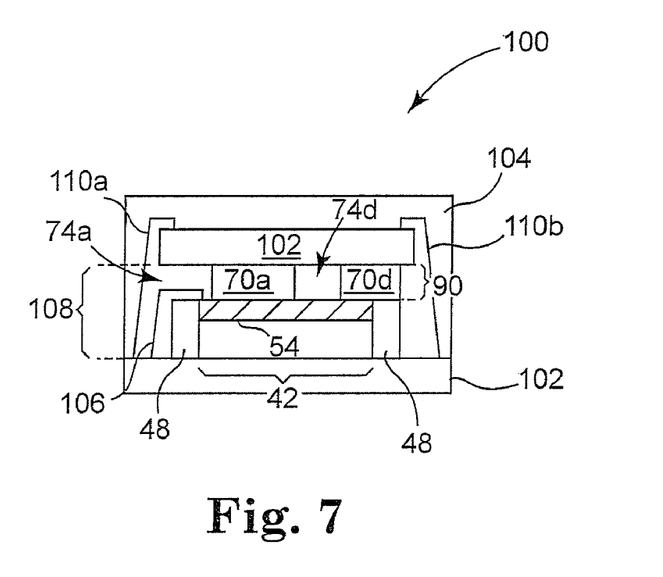
FIG. 7 is a diagram illustrating one embodiment of a stacked die package including a patterned spacer.

FIG. 7 is a diagram illustrating one embodiment of a stacked die package 100 according to the present invention. Stacked die package 100 includes a package substrate 102, semiconductor die 42, spacer 90, stacked semiconductor die 102, and encapsulation material 104. Stacked die package 100 can be any suitable type of package, such as a stacked die lead frame package, a stacked die BGA package, or a stacked die CSP.

Semiconductor die 42 and internal spacing areas 48 support spacer 90, which includes spacer layer portions 70*a* and 70*d*. Semiconductor die 42 has spacer layer portions 70*a* and 70*d* on active area 54. Spacer layer portions 70*a* and 70*d* support stacked semiconductor die 102. Open areas 74*a* and 74*d* provide space for bond wires and operation of active area 54 in stacked die package 100.

Semiconductor die 42 and internal spacing areas 48 are attached to substrate 102 and semiconductor die 42 is electrically coupled to substrate 102 via first wire loop 106. Spacer 90 is attached to semiconductor die 42, where spacer 90 is a singulated piece of spacer layer 70 disposed on semiconductor wafer 40. In one aspect, semiconductor device 108 in stacked die package 100 includes semiconductor die 42 and spacer 90, which are fabricated together via the wafer level processing. Stacked semiconductor die 102 is attached to spacer 90 and electrically coupled to substrate 102 via second wire loops 110a and 110b. Encapsulation material 104 is disposed over semiconductor die 42, spacer 90, and stacked semiconductor die 102.

In one embodiment, semiconductor die 42 is electrically coupled to stacked semiconductor die 102 via first wire loop 106 and second wire loops 110a and 110b. In one embodiment, semiconductor die 42 is a flip chip attached and electrically coupled to substrate 102 and spacer 90 is attached to the back of semiconductor die 42, where spacer 90 is a piece of space layer 70 disposed onto the back of the semiconductor wafer 40.

In one embodiment, stacked semiconductor dice, such as stacked semiconductor die 102, are attached to spacer layer 70 on wafer 40 prior to dicing or singulating wafer 40. Wafer 40 is diced to provide singulated semiconductor die 42, spacer 90, and stacked semiconductor die 102. The combination of semiconductor die 42, spacer 90, and stacked semiconductor die 102 are attached to package substrate 102 in stacked die package 100.

Figure 8:
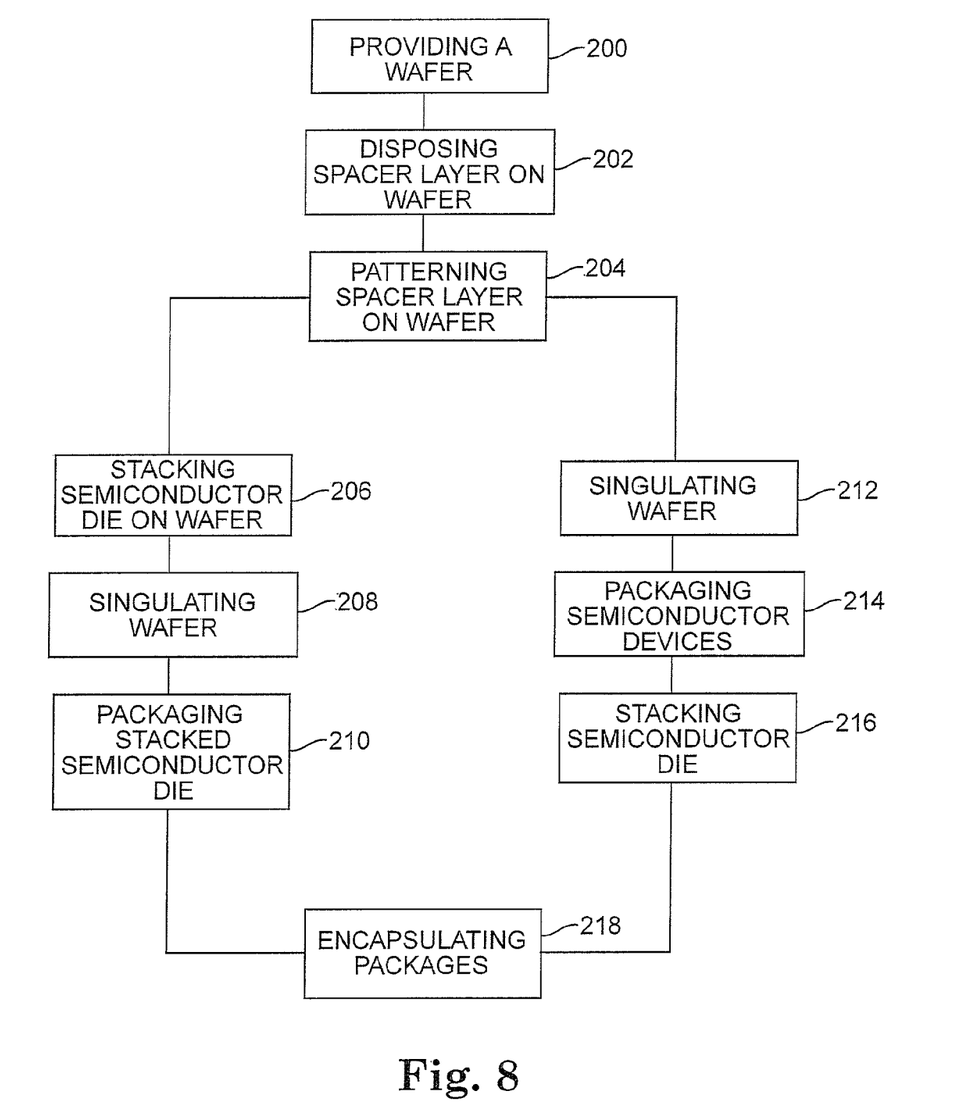
FIG. 8 is a flow chart diagram illustrating packaging of semiconductor dice in a stacked die package.

FIG. 8 is a flowchart diagram illustrating one embodiment of packaging of semiconductor dice 42, 44, and 46 in a stacked die package. At 200, wafer 40 is provided including multiple active areas 54, 56, and 58 and internal spacing areas 48 around the perimeter of wafer 40 and between semiconductor dice 42, 44, and 46. At 202, spacer layer 70 is disposed on wafer 40 in a wafer level batch process as either a solid slab of material or a liquid. Spacer layer 70 is disposed on either the top side 50 or the back side 52 of wafer 40.

At 204, spacer layer 70 is patterned to accommodate active areas defining topologies including bond pads in semiconductor dice. In one embodiment, spacer layer 70 is disposed on the top side 50 of wafer 40 and patterned to accommodate active areas 54, 56, and 58 in semiconductor dice 42, 44, and 46. In one embodiment, a spacer layer is disposed on the back side 52 of wafer 40 and the spacer layer is structured to accommodate active areas in semiconductor dice stacked below semiconductor dice 42, 44, and 46 in stacked die packages. In other embodiments, spacer layer 70 is preformed and/or patterned in a wafer level process prior to being disposed on wafer 40 at 202.

In one packaging system, at 206, other semiconductor dice are stacked on wafer 40 above or below each of the semiconductor dice 42, 44, and 46. The other semiconductor dice can be stacked via gluing or taping the other semiconductor dice onto spacer layer 70 on wafer 40. Next, the process of disposing a spacer layer at 202, patterning the spacer layer at 204, and stacking semiconductor dice at 206 can be repeated to stack any suitable number of semiconductor dice on wafer 40.

At 208, wafer 40 is singulated to provide stacks, where each stack includes at least one of the singulated semiconductor die 42, 44, and 46, one of the spacers 90, 92, and 94, and one of the other semiconductor dice. At 210, each of the stacks is attached to a different package substrate, where each package includes at least one of the singulated semiconductor die 42, 44, and 46, one of the spacers 90, 92, and 94, and one of the other semiconductor dice. At 218, packages are encapsulated via encapsulation material 104.

In one packaging system, at 212, wafer 40 is singulated to provide singulated semiconductor die 42, 44, and 46 and singulated spacers 90, 92, and 94. At 214, each of the singulated semiconductor die 42, 44, and 46 is attached to a different package substrate, where each package includes a semiconductor device 108 including one of the singulated semiconductor die 42 and one of the spacers 90, 92, and 94. At 216, another semiconductor die is stacked onto and attached to each of the spacers 90, 92, and 94. At 218, the packages are encapsulated via encapsulation material 104.

In other packaging systems, the packaging systems at 206 and at 212 can be combined to provide any suitable combination of semiconductor die 42, 44, and 46, spacers, and other stacked semiconductor dice.

Singulated spacers are produced in a wafer level process to provide spacing between semiconductor dice in a stacked die package. The singulated spacers provide room for active areas including bond wires and can be patterned to support stacked die in the stacked die package. The spacers are produced in a wafer level process, which reduces production time, production inventories, and system costs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor wafer structure, comprising:
a semiconductor wafer including active areas on a top side and having a back side that opposes the top side; and
a solid spacer layer configured to be singulated into spacers that provide spacing between semiconductor dice in stacked die packages, wherein the solid spacer layer is attached to and directly contacts the back side of the semiconductor wafer, and the solid spacer layer is patterned to include open areas configured to be situated over bond pads of semiconductor die from at least one other semiconductor wafer in the stacked die packages and patterned to include other open areas configured to be situated over at least one of an active element, a MEM system, a sensor, or a light emitting element of the semiconductor die from the at least one other semiconductor wafer in the stacked die packages, wherein the solid spacer layer includes different patterns corresponding to different full semiconductor die from the at least one other semiconductor wafer.

2. The semiconductor wafer structure of claim 1, wherein the solid spacer layer is attached to the semiconductor wafer via one of an adhesive, solder, and anodic bonding.

3. The semiconductor wafer structure of claim 1, wherein the solid spacer layer is patterned before being disposed on the back side of the semiconductor wafer.

4. The semiconductor wafer structure of claim 1, wherein the solid spacer layer is patterned via one of photolithographic processing and etching, and photoablation.

5. The semiconductor wafer structure of claim 1, wherein the solid spacer layer is patterned via a mechanical treatment.

6. The semiconductor wafer structure of claim 5, wherein the mechanical treatment includes one of sawing, milling, grinding, punching, molding, casting, and drilling.

7. A method of packaging semiconductor dice, comprising:
providing semiconductor dice in a semiconductor wafer;
disposing a pre-formed solid spacer layer on one side of the semiconductor wafer; and thereafter
patterning the pre-formed solid spacer layer, wherein the patterning creates open areas in the pre-formed solid spacer layer and the open areas are situated over active areas defining a topology in semiconductor dice in packages.

8. The method of claim 7, wherein disposing a pre-formed solid spacer layer, comprises:
attaching the pre-formed solid spacer layer via one of an adhesive, solder, and anodic bonding.

9. The method of claim 7, comprising:
patterning the pre-formed solid spacer layer via one of photolithographic processing and etching, and photoablation.

10. The method of claim 7, comprising:
patterning the pre-formed solid spacer layer via a mechanical treatment.

11. The method of claim 7, comprising:
patterning the pre-formed solid spacer layer via one of sawing, milling, grinding, punching, molding, casting, and drilling.

12. A method of providing spacers in stacked die packages, comprising:
providing semiconductor dice in a semiconductor wafer including active areas;
attaching a pre-formed solid slab spacer layer to one side of the semiconductor wafer; and thereafter
patterning the pre-formed solid slab spacer layer, wherein the patterning creates open areas in the pre-formed solid slab spacer layer and the open areas are situated over at least one of a bond pad, an active element, a MEM system, a sensor, or a light emitting element in semiconductor dice in the stacked die packages.

13. The method of claim 12, comprising:
singulating the pre-formed solid slab spacer layer into singulated spacers.

14. The method of claim 13, wherein the semiconductor dice are integrated circuits and comprising:
singulating the semiconductor wafer into singulated integrated circuit die.

15. The method of claim 12, wherein attaching a pre-formed solid slab spacer layer comprises:
attaching the pre-formed solid slab spacer layer to the back side of the semiconductor wafer.

16. The method of claim 7, wherein patterning the pre-formed solid spacer layer includes providing different patterns corresponding to different ones of the semiconductor dice.

* * * * *